United States Patent [19]

Horng et al.

[11] 4,211,582
[45] Jul. 8, 1980

[54] PROCESS FOR MAKING LARGE AREA ISOLATION TRENCHES UTILIZING A TWO-STEP SELECTIVE ETCHING TECHNIQUE

[75] Inventors: Cheng T. Horng, Fishkill, N.Y.; Robert O. Schwenker, San Jose, Calif.

[73] Assignee: International Business Machines Corporation, Armonk, N.Y.

[21] Appl. No.: 52,997

[22] Filed: Jun. 28, 1979

[51] Int. Cl.² .................. H01L 21/76; H01L 21/306
[52] U.S. Cl. ............................. 148/1.5; 29/576 W; 29/578; 29/580; 148/175; 148/187; 156/643; 156/644; 156/653; 156/657; 156/662; 204/192 E; 357/49; 357/50; 357/55; 357/56
[58] Field of Search .................. 148/1.5, 175, 187; 204/192 E; 156/643, 644, 653, 657, 662; 29/576 W, 578, 580; 357/49, 50, 55, 56

[56] References Cited

U.S. PATENT DOCUMENTS

| | | | |
|---|---|---|---|
| 3,938,241 | 2/1976 | George et al. | 29/580 X |
| 3,966,577 | 6/1976 | Hochberg | 156/643 X |
| 3,997,378 | 12/1976 | Kaji et al. | 148/175 X |
| 4,007,104 | 2/1977 | Summers et al. | 156/643 X |
| 4,042,726 | 8/1977 | Kaji et al. | 156/653 X |
| 4,044,452 | 8/1977 | Abbas et al. | 357/50 X |
| 4,104,086 | 8/1978 | Bondur et al. | 148/1.5 |
| 4,139,442 | 2/1979 | Bondur et al. | 204/192 E |
| 4,140,558 | 2/1979 | Murphy et al. | 148/175 |

OTHER PUBLICATIONS

Abbas, S. A., "Recessed Oxide Isolation Process", I.B.M. Tech. Discl. Bull., vol. 20, No. 1, Jun. 1977, pp. 144-145.

*Primary Examiner*—R. Dean
*Assistant Examiner*—W. G. Saba
*Attorney, Agent, or Firm*—Robert J. Haase

[57] ABSTRACT

A method for making wide, deep recessed oxide isolation trenches in silicon semiconductor substrates. A semi-conductor substrate is selectively etched to produce a spaced succession of narrow, shallow trenches separated by narrow silicon mesas. Silicon oxide is chemical-vapor-deposited on the horizontal and vertical surfaces of the etched structure to a thickness equalling the width of a desired silicon oxide mask. The mask is used for etching multiple deep trenches in the substrate, the trenches being separated by thin walls of silicon. The thickness of the walls is uniformly equal to and determined by the thickness of the deposited silicon oxide mask.

The deposited silicon oxide is reactively ion etched away from the horizontal surfaces, leaving the oxide only on the sidewalls of the shallow trenches. The silicon is deeply etched, using the remaining oxide as a mask. Boron is ion implanted and the resulting structure is thermally oxidized sufficiently to completely oxidize the silicon under the deposited oxide mask and to oxidize the silicon surfaces at the bottoms of the trenches. The remaining trench volume is filled in with chemical-vapor-deposited silicon dioxide.

7 Claims, 5 Drawing Figures

PROCESS FOR MAKING LARGE AREA ISOLATION TRENCHES UTILIZING A TWO-STEP SELECTIVE ETCHING TECHNIQUE

FIELD OF THE INVENTION

The method generally relates to methods for making wide, deep trenches in semiconductor material and for filling such trenches with dielectric material for providing low capacitive substrate regions for supporting signal carrying surface conductors.

DESCRIPTION OF THE PRIOR ART

Large scale integrated circuit fabrication requires that signal carrying surface conductors be provided to connect the individual active and passive circuit elements into functional configurations. It is desirable, of course, that such surface conductors be isolated effectively from the semiconductor substrate so that unwanted capacitive coupling to the substrate is minimized.

One technique to minimize unwanted coupling to the substrate is described in U.S. Pat. No. 4,139,442, issued to Bondur et al. on Feb. 13, 1979, for "Reactive Ion Etching Method For Producing Deep Dielectric Isolation in Silicon", in the names of James Bondur et al. and assigned to the present assignee. Briefly, the technique provides a narrow-line width oxide masking layer for the reactive ion etching of multiple deep trenches in a silicon substrate. The deep trenches are separated from each other by thin walls of silicon determined by the oxide mask line width. The silicon walls are later fully converted to silicon oxide by a thermal oxidation step.

It is important that the thickness of the walls of silicon be closely controlled so that they are thick enough for structural strength to prevent breaking and yet not too thick for reasonable thermal oxidation times. Even with the use of electron beam photoresist technology, to delineate the oxide mask line width, it is difficult to achieve the required degree of control when writing narrow line widths of about 0.5 micrometers.

SUMMARY OF THE INVENTION

A precisely controllable, narrow line width masking layer for etching semiconductor substrates is formed by a process which includes the step of selectively etching a semiconductor substrate to produce a spaced succession of narrow, shallow trenches having substantially vertical walls. A conformal coating of a masking material is deposited on the etched substrate and the coated substrate is etched so as to remove the conformal coating from the horizontal surfaces of the etched substrate while leaving the coating on the vertical surfaces of the etched substrate.

With the remaining masking material in place, the substrate is reactively ion etched to produce a spaced succession of narrow, deep trenches separated by narrow semiconductor mesas, the alternate trenches being of equal first depth and the intervening alternate trenches being of equal second depth different from the first depth. The width of each of the silicon mesas is substantially equal to and determined by the thickness of the deposited conformal coating. Thus, the width of the mesas is controlled to the same high degree as is the thickness of the coating.

The resulting structure is thermally oxidized sufficiently to completely oxidize the semiconductor material underneath the remaining deposited conformal coating and the remaining trench volume is filled with dielectric material.

DESCRIPTION OF THE PREFERRED EMBODIMENTS

Figure 1:
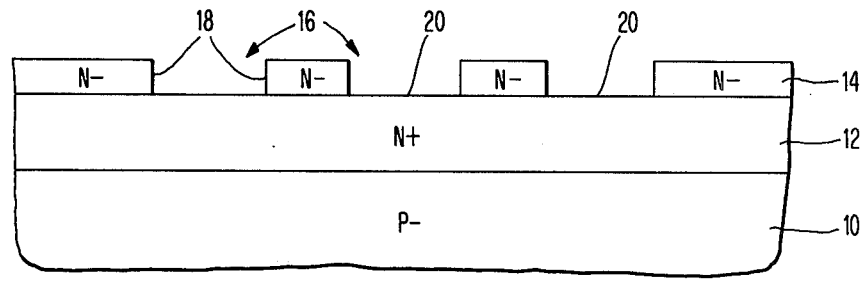
FIGS. 1, 2, 3, 4 and 5 are simplified cross-sectional views of the structure obtaining at successive times during the fabrication of a wide, deep recessed oxide isolation trench in a silicon semiconductor substrate in accordance with the present invention.

The structure of FIG. 1 includes monocrystalline silicon substrate 10 which is shown as P− conductivity type for illustration purposes, N+ layer 12 over the substrate 10 and N− conductivity layer 14 on the layer 12. For the purposes of the invention, either all or some of the layers 10, 12 and 14 could be of opposite conductivity type from the conductivity types indicated. However, it is preferred that layer 12 be of high conductivity where localized portions of it later become the subcollectors of bipolar transistors.

The structure of FIG. 1 can be fabricated by various techniques. The preferred technique, however, is to provide a P− monocrystalline silicon substrate 10 and to diffuse an N+ blanket diffusion into the substrate (to produce region 12) by using conventional diffusion or ion implantation of an N-type impurity such as arsenic, antimony or phosphorous to produce an N+ region with a surface concentration of between about $1 \times 10^{19}$ to $1 \times 10^{21}$ atoms/cc. The layer 14 is subsequently grown over layer 12 by means of epitaxial growth. This may be done by conventional techniques, such as by the use of $SiCl_4/H_2$ or $SiH_4/H_2$ mixtures at growth temperatures of about 1,000° C. to 1,200° C. The N+ layer may have a typical thickness of from about 1 to 3 microns whereas the epitaxial layer may have a thickness of from about 0.5 to 10 microns, the exact thicknesses depending upon the device to be built.

Alternatively, the structure could be made by various combinations of thermal diffusion, ion implantation and/or epitaxial growth which would include the formation of a buried subcollector region where subsequent formation of bipolar transistors is desired. In certain device structures, buried highly doped regions or layers are not necessary and can therefore be omitted. This is true for FET type devices. Alternatively, multiple buried highly doped regions of different dopant types could be formed by multiple epitaxial and diffusion processing. These structures could be needed for buried subcollectors as well as for buried conductor lines.

The silicon structure comprising substrate 10, N+ layer 12 and N− layer 14 is patterned by conventional photolithography techniques (not shown) and is selectively etched to produce narrow, shallow trenches 16 having substantially vertical walls 18 and horizontal bottom surfaces 20, as shown in FIG. 1. As will be described more fully later, the width of the shallow trenches 20 is of the order of about 2.5 microns or less so that when filled with a combination of thermal oxide and chemical-vapor-deposited oxide (or other chemical-vapor-deposited material), the trenches primarily are filled by deposits built up on the vertical walls, i.e., the trenches are filled in an inward direction by deposits on the sidewalls rather than in an upward direction by deposits on the trench bottoms. This is distinguished from the filling of a relatively wide trench which would require much thicker deposits because such a trench primarily would be filled in a direction upwards from the trench bottom.

Figure 2:
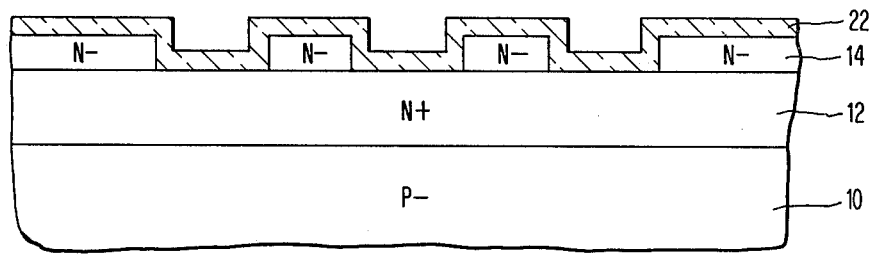

Referring now to FIG. 2, a conformal coating 22 of a masking material is deposited upon the etched structure of FIG. 1 by a chemical vapor deposition method or by a plasma deposition method, so that the coating is deposited with uniform thickness on the horizontal as well as the vertical surfaces of the etched semiconductor body. The thickness of the deposited conformal coating 22 is selected to be equal to the width of each of a spaced succession of semiconductor mesas to be described later in connection with FIG. 4.

Figure 3:
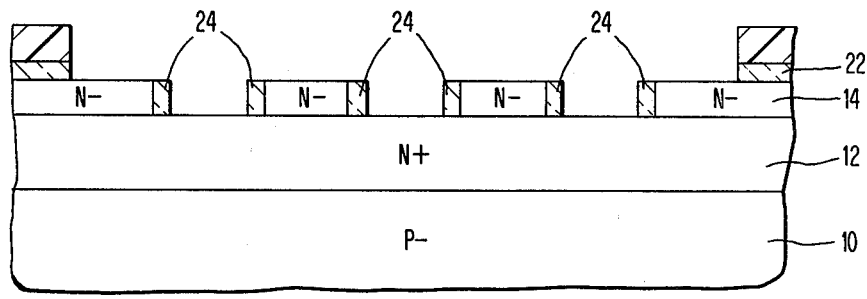

The coated semiconductor body is reactively ion etched to remove the conformal coating 22 from the horizontal body surfaces and to leave the coating 22 along only the vertical surfaces of the etched body as shown in FIG. 3. A suitable chemical-vapor-deposition process for depositing conformal coating 22 and a suitable reactive ion etching process for removing coating 22 from the horizontal body surfaces are described in copending patent application, Ser. No. 957,604, for "Method for Forming a Narrow Dimensioned Region on a Body", filed on Nov. 3, 1978, in the name of H. B. Pogge and assigned to the present assignee. As set forth in said copending patent application, it is important that the vertical surfaces 18 of the etched semiconductor body, as shown in FIG. 1, be substantially vertical (equal to or less than about 5 degrees from the vertical) so as to produce the desired result as shown in FIG. 3 subsequent to the reactive ion etching step. The conformal coating 22 may be composed of a variety of materials or combinations of materials which include silicon dioxide, silicon nitride, aluminum oxide, and the like. The reactive ion etching apparatus and process are further described in copending patent application, Ser. No. 594,413, filed July 9, 1975 in the name of J. N. Harvilchuck and in continuation patent application, Ser. No. 822,755 filed Aug. 8, 1977 and assigned to the present assignee. The reactive ion or plasma ambient in the Harvilchuck et al. patent application is reactive chlorine, bromine or iodine species, preferably a combination of the chlorine species with an inert gas such as argon. Application of suitable power in the order of about 0.1 to 0.50 watts/cm$^2$ from an RF voltage source will produce sufficient power density to cause the reactive ion etching operation of the conformal coating 22 to be carried out at a rate of about 0.01 to 0.5 micrometers per minute.

The desired result of the etching is shown in FIG. 3 wherein the conformal coating 22 is substantially or completely removed from the horizontal surfaces of the semiconductor body. There is substantially no effect on the coating 22 which is present on the vertical surfaces 18 of the trenches 16. The result is the narrow dimensioned regions 24 of the original conformal coating 22 as shown in FIG. 3.

Figure 4:
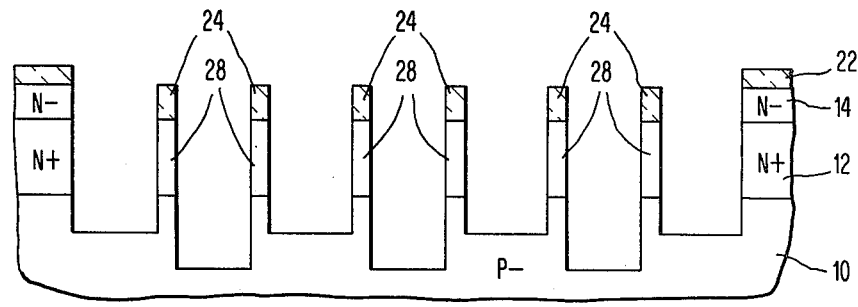

The structure of FIG. 3 is reactively ion etched to the intended depth of the desired wide, deep recessed oxide isolation trenches, using the remaining conformal coating portions 24 as the etching mask. The result is shown in FIG. 4. It will be noted that all of the trenches penetrate into P$^-$ substrate 10.

As is well understood in the art, the formation of a P$^{30}$ region underneath the dielectric material which will be used to fill the etched trenches of FIG. 4, may be desirable when the substrate is P$^-$ as is the case in the disclosed embodiment. The P$^-$ region has a tendency to change its resistivity, even to the extent of inverting to N-type material, when it is subjected to thermal oxidation. A P$^+$ implant in substrate 10 at the bottoms of the individual etched trenches prevents such inversion possibility. This may be formed by use of a P$^+$ ion implantation of a dopant such as boron. Accordingly, a thin silicon dioxide layer (not shown) is deposited on the structure of FIG. 4 to act as a screen for the aforesaid boron ion implantation and the ion implantation is carried out to produce the P$^+$ channel stops 26 shown in FIG. 5.

Figure 5:
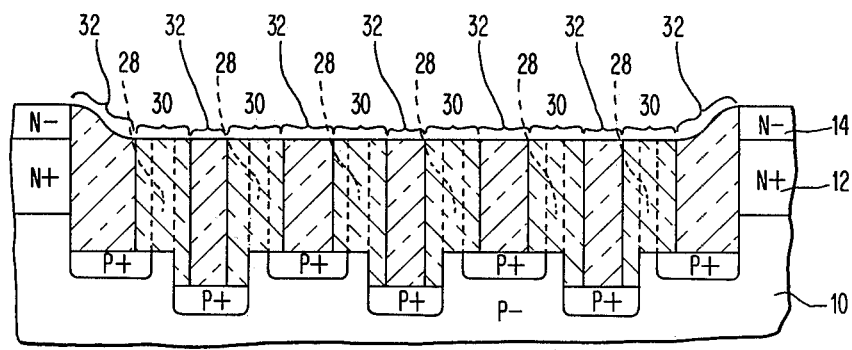

After the implantation step, the resulting structure is thermally oxidized to convert all of the silicon in the mesas 28 of FIG. 4 to silicon dioxide. The thermally grown silicon dioxide occupies regions 30 as shown in FIG. 5. At this point, there remain unfilled volumes 32 of trenches (adjacent the regions 30 of FIG. 5). The remaining unfilled trench portions 32 are filled by the chemical-vapor-deposition or plasma deposition of silicon dioxide or other dielectric material. The deposited dielectric material is removed from the surfaces of the semiconductor body corresponding to the device regions 34 by selective etching in a conventional manner. The wide, deep recessed isolation trench, filled with dielectric material as shown in FIG. 5, provides a structure for supporting signal carrying surface conductors (not shown) with minimum capacitive coupling to underlying substrate 10.

Having thus described our invention, what we claim as new, and desire to secure by Letters Patent is:

1. A method for making wide, deep recessed oxide isolation trenches in a semiconductor substrate comprising:

forming a spaced succession of narrow, shallow trenches in said substrate, said shallow trenches having substantially vertical sidewalls and being saparated by semiconductor mesas, depositing a predetermined thickness of a masking material on the sidewall and on the bottom surfaces of said shallow trenches and on the top surfaces of said mesas, etching said coating to remove said coating substantially only from said bottom surfaces of said shallow trenches and from the top surfaces of said mesas, reactively ion etching said substrate using said coating on said sidewalls of said shallow trenches as a reactive ion etching mask to produce a spaced succession of narrow, deep trenches separated by narrow semiconductor mesas, the thickness of said narrow semiconductor mesas being substantially equal to and determined by the thickness of said coating, and thermally oxidizing said substrate so as to completely oxidize the semiconductor material of said narrow semiconductor mesas.

2. The method defined in claim 1 and further including the step of filling in any remaining spaces between said oxidized narrow semiconductor mesas by depositing a dielectric material.

3. The method defined in claim 2 wherein said dielectric material is chemical-vapor-deposited or plasma deposited silicon dioxide.

4. The method defined in claim 1 wherein said masking material is chemical-vapor-deposited or plasma deposited.

5. The method defined in claim 4 wherein said masking material is silicon dioxide.

6. The method defined in claim 1 wherein said sidewalls of said narrow, shallow trenches are within about 5 degrees from the vertical.

7. The method defined in claim 1 wherein boron is implanted into the bottom surfaces of said narrow, deep trenches prior to said thermally oxidizing step.

* * * * *